United States Patent
Sudo et al.

(10) Patent No.: US 9,328,009 B2
(45) Date of Patent: May 3, 2016

(54) VITREOUS SILICA CRUCIBLE FOR PULLING SILICON SINGLE CRYSTAL, AND METHOD FOR MANUFACTURING THE SAME

(75) Inventors: Toshiaki Sudo, Akita (JP); Hiroshi Kishi, Akita (JP); Eriko Suzuki, Akita (JP)

(73) Assignee: SUMCO CORPORATION, Tokyo (JP)

( * ) Notice: Subject to any disclaimer, the term of this patent is extended or adjusted under 35 U.S.C. 154(b) by 992 days.

(21) Appl. No.: 13/106,993

(22) Filed: May 13, 2011

(65) Prior Publication Data

US 2012/0285372 A1 Nov. 15, 2012

(51) Int. Cl.
| C30B 15/02 | (2006.01) |
| C03B 19/09 | (2006.01) |
| C30B 11/00 | (2006.01) |
| C30B 29/06 | (2006.01) |
| C30B 35/00 | (2006.01) |

(52) U.S. Cl.
CPC ............. C03B 19/095 (2013.01); C30B 11/002 (2013.01); C30B 29/06 (2013.01); C30B 35/002 (2013.01); *Y02P 40/57* (2015.11); *Y10T 117/1032* (2015.01)

(58) Field of Classification Search
USPC ...................................... 117/13, 20, 932, 200
See application file for complete search history.

(56) References Cited

U.S. PATENT DOCUMENTS

| 6,548,131 | B1 * | 4/2003 | Fabian et al. ................. 428/34.4 |
| 8,172,945 | B2 * | 5/2012 | Shimazu ........................ 117/208 |
| 8,449,352 | B2 * | 5/2013 | Fukui et al. ..................... 451/65 |
| 2010/0319609 | A1 | 12/2010 | Sato | |

FOREIGN PATENT DOCUMENTS

| JP | 2000-327478 A | 11/2000 |
| JP | 2004-250304 A | 9/2004 |
| JP | 2009-102206 A | 5/2009 |

OTHER PUBLICATIONS

Japanese Office Action for Japanese Patent Application No. 2009-263340 dated Jul. 11, 2013.

* cited by examiner

*Primary Examiner* — Robert M Kunemund
(74) *Attorney, Agent, or Firm* — Law Office of Katsuhiro Arai

(57) ABSTRACT

Provided is a vitreous silica crucible for pulling a silicon single crystal, which stably suppresses surface vibration of a silicon melted solution filled therein and has a long life, and a method for manufacturing the same. The vitreous silica crucible for pulling a silicon single crystal includes a peripheral wall portion, a curved portion, and a bottom portion, wherein a plurality of minute concave portions are formed on a certain area of an inner surface of the peripheral wall portion, and a plurality of bubbles are formed on a lower position of the minute concave portions.

6 Claims, 5 Drawing Sheets

VITREOUS SILICA CRUCIBLE FOR PULLING SILICON SINGLE CRYSTAL, AND METHOD FOR MANUFACTURING THE SAME

BACKGROUND OF THE INVENTION

1. Field of the Invention

The present invention relates to a vitreous silica crucible and a method of manufacturing the same, and more particularly, to a vitreous silica crucible for pulling silicon single crystal and a method of manufacturing the same.

2. Description of Related Art

In general, the Czochralski (CZ) method is widely used as a method of fabricating silicon single crystal. According to the CZ method, as shown in FIGS. 1 and 2, a monocrystalline seed crystal 102 is first dipped into silicon melt 101 in a vitreous silica crucible 100. The silicon melt 101 is obtained from polycrystalline silicon. At this point, the seed crystal 102 receives drastic thermal shock, and thus a dislocation is formed at a tip portion of the seed crystal. To remove the dislocation, a neck portion 103 is formed using a predetermined method, such that the dislocation is not transferred to silicon that grows thereafter. Next, a shoulder portion 104 is formed by gradually increasing the diameter of the seed crystal 102 by rotating and slowly pulling the seed crystal 102 while controlling a speed of the pulling and the temperature of the silicon melt. When the diameter of the seed crystal 102 reaches a desired diameter, the seed crystal 102 is continuously pulled up and controlled, so that the diameter of the seed crystal 102 is constant. Accordingly, a straight body portion 105 is formed. Finally, a silicon single crystal ingot 107 is formed by forming a tail portion 106 by gradually reducing the diameter.

A vitreous silica crucible used for pulling such silicon single crystal generally includes, as shown in FIG. 1, natural fused silica 108, which constitutes the outer portion of the vitreous silica crucible to improve its mechanical strength, and synthetic fused silica 109, which constitutes the inner portion of the vitreous silica crucible to avoid mixing of impurities. Here, the term 'natural fused silica' refers to vitreous silica formed of natural silica powder, whereas the term 'synthetic fused silica' refers to vitreous silica formed of synthetic silica powder. Generally, a reaction $SiO_2$ (solid) →Si (liquid)+2O occurs at the interface between the synthetic fused silica 109 and the silicon melt 101, and thus the synthetic fused silica 109 is dissolved. While the silicon single crystal is being pulled up, a reaction Si (liquid)+O→SiO (gas) may occur according to conditions, such as a rise in a pulling temperature or a drop in atmospheric pressure. As a result, SiO gas is formed, and, as shown in FIGS. 3(a) and 3(b), the silicon melt 101 may bounce off a surface of the synthetic fused silica 109, and thus melt surface vibration may occur. Furthermore, for convenience of explanation of melt surface vibration, melt surface vibration shown in FIGS. 3(a) and 3(b) is exaggerated.

When such melt surface vibration occurs, the seed crystal 102 may not adhere to a flat melt surface. Furthermore, silicon becomes a silicon poly-crystal while the silicon is being pulled up. In particular, the processes of dipping a seed and forming a shoulder portion in the early stage of the process of pulling the silicon single crystal are easily affected by melt surface vibration, and effects of the melt surface vibration significantly affect quality of a pulled-up silicon single crystal ingot. Therefore, there is demand for a technique for suppressing melt surface vibration of silicon melt during the processes.

JP-A-2004-250304 discloses a technique for adjusting content rate of bubbles in the inner-circumferential surface of a vitreous silica crucible near a melt surface during pulling-up start to be within a predetermined range to suppress melt surface vibration of silicon melt filled inside the vitreous silica crucible. The technique is based on a discovery that melt surface vibration of silicon melt at the time of starting to pull silicon is affected by the content rate of bubbles in the inner-circumferential surface of a vitreous silica crucible near a melt surface.

For example, in the case where a vitreous silica crucible contains a large number of bubbles, the vitreous silica is dissolved as the reaction $SiO_2$ (solid)→Si (liquid)+2O proceeds, and thus opened bubbles 201 as shown in FIG. 4 are formed. The opened bubbles 201 may suppress melt surface vibration according to the same mechanism that boiling chips prevent an abrupt boiling phenomenon. However, if vitreous silica contains a large number of bubbles 202, a ratio of the crucible itself with respect to the volume of the vitreous silica crucible substantially decreases, and thus a dissolution speed increases as compared to the case in which no bubbles are formed. As a result, the lifespan of the vitreous silica crucible is reduced. Recently, a crucible with a large diameter is required to pull silicon single crystal with a large diameter, and thus the cost of a vitreous silica crucible is high. Therefore, there is demand for a vitreous silica crucible, which is capable of suppressing the melt surface vibration and also has a long lifespan due to a slow dissolution speed. Furthermore, unopened bubbles just below the inner surface of the surrounding wall of a crucible expand and rupture while the silicon single crystal is being pulled up, and thus silica fragments are mixed into silicon melt. Therefore, there is also demand for improvement in yield of silicon single crystal.

SUMMARY OF THE INVENTION

To solve the above problems, the present invention provides a vitreous silica crucible for pulling silicon single crystal, which is capable of stably suppressing melt surface vibration of silicon melt filled inside the vitreous silica crucible and has a long lifespan and a method for manufacturing the vitreous silica crucible.

According to an aspect of the present invention, there is provided a vitreous silica crucible for pulling silicon single crystal, which includes a surrounding wall portion, a curved portion, and a bottom portion, wherein the vitreous silica crucible comprises a plurality of micro recesses in a particular area of an inner surface of the surrounding wall portion; and a plurality of bubbles in a location radially outward of the micro recesses.

If the height of the vitreous silica crucible is indicated by H, the particular area may be located in an area between 0.50H and 0.99H when measured from the bottom portion of the vitreous silica crucible.

The particular area may include at least one of the micro recesses in each of circular ring-shaped inner surface portions defined at an interval from 0.1 mm to 5.0 mm in the heightwise direction of the vitreous silica crucible.

The average diameter of the micro recesses may be from 1 μm to 500 μm.

The average depth of the micro recess may be a depth corresponding to from 0.05% to 50% of the thickness of the vitreous silica crucible at the surrounding wall portion.

The average diameter of the bubbles may be from 10 μm to 100 μm, and the density of the bubbles may be from 30 bubbles per $mm^3$ to 300 bubbles per $mm^3$.

In an area of the synthetic fused silica layer, the area including the plurality of bubbles may be an area corresponding to from 0.5% to 30% of the thickness of the vitreous silica crucible at the surrounding wall portion.

According to another aspect of the present invention, there is provided a method of manufacturing a vitreous silica crucible for pulling silicon single crystal, which includes a surrounding wall portion, a curved portion, and a bottom portion, and is formed of double layers including an outer layer, which is a natural fused silica layer, and an inner layer, which is a synthetic fused silica layer, the method including a process for forming the outer layer formed of natural silica powder; a process for forming the inner layer formed of synthetic silica powder on an inner surface of the outer layer; and a process for forming the vitreous silica crucible including the surrounding wall portion, the curved portion, and the bottom portion by generating an arc discharge inside the inner layer and fusing, wherein foamable synthetic silica powder is used in a portion of the inner layer to be located below a plurality of recesses to be formed later in a particular area of an inner surface of the surrounding wall portion during the process of forming the inner layer, and the method further includes a micro recess forming process for forming the plurality of micro recesses in the particular area after the process of forming the vitreous silica crucible.

The micro recesses may be formed through physical grinding using a carbon dioxide gas laser, a diamond tool, or the like.

The present invention provides a vitreous silica crucible for pulling silicon single crystal, wherein the vitreous silica crucible includes a plurality of micro recesses in a particular area of the inner surface of a surrounding wall portion, and a plurality of bubbles in a location below the micro recesses, thereby stably suppressing melt surface vibration of silicon melt filled inside the vitreous silica crucible, and has a long lifespan, and a method of manufacturing the vitreous silica crucible.

DESCRIPTION OF THE PREFERRED EMBODIMENTS

Figure 1:
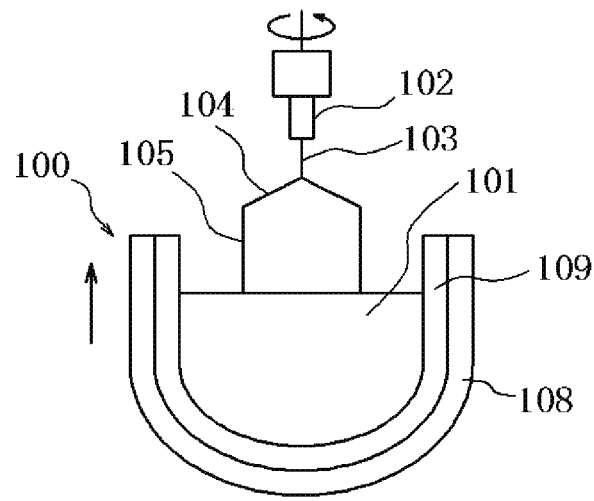
FIG. 1 is a schematic sectional view for describing a method of manufacturing silicon single crystal.
Figure 2:
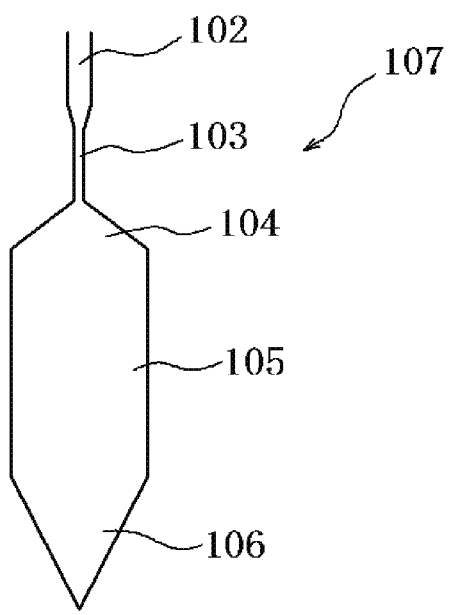
FIG. 2 is a plan view of an ordinary silicon ingot fabricated by a pulling method.
Figure 3A:
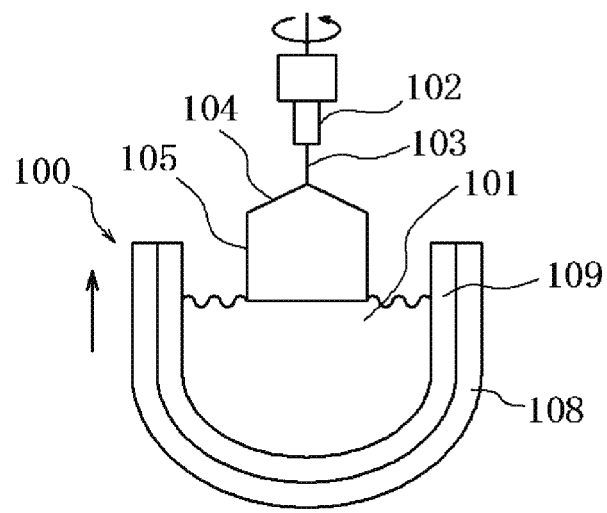
FIG. 3(a) is a schematic sectional view for describing melt surface vibration of silicon melt.
Figure 3B:
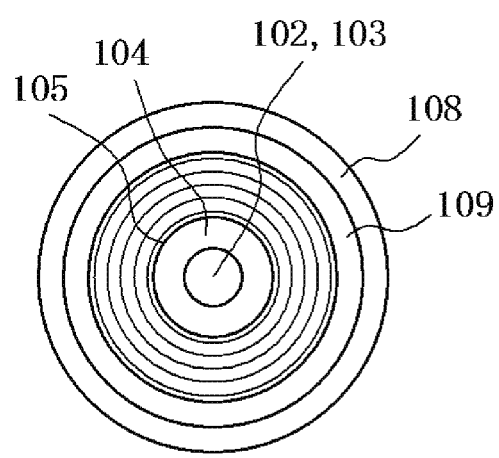
FIG. 3(b) is a schematic plan view showing melt surface vibration of silicon melt.
Figure 4:
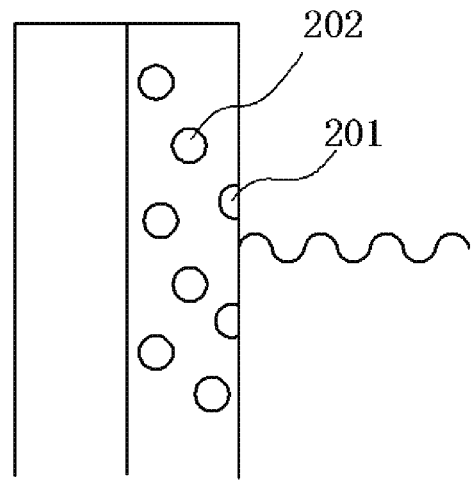
FIG. 4 is a schematic sectional view of a surrounding wall portion of a crucible, showing bubbles included in a conventional vitreous silica crucible.
Figure 5:
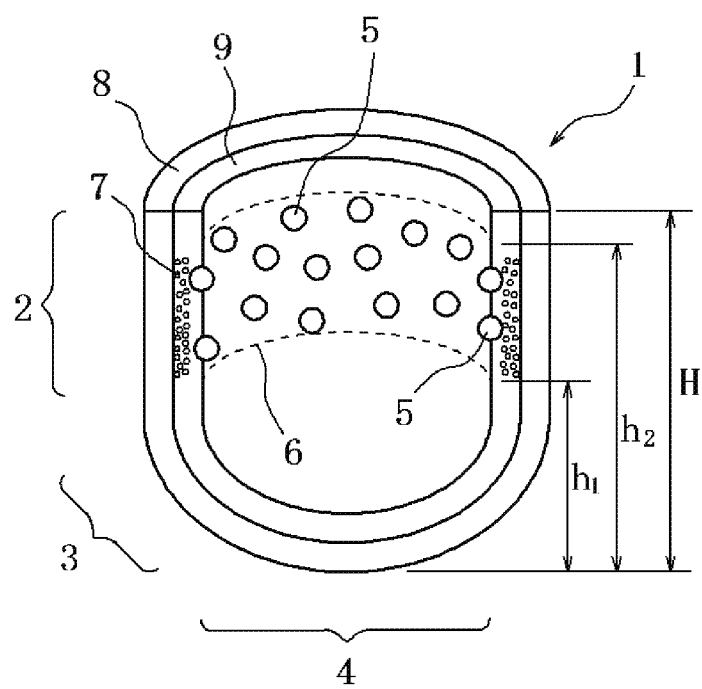
FIG. 5 is a perspective sectional view of a vitreous silica crucible for pulling silicon single crystal according to the present invention.

Hereinafter, a vitreous silica crucible for pulling silicon single crystal and a method for manufacturing the vitreous silica crucible according to embodiments of the present invention will be described with reference to the attached drawings. For example, as shown in FIG. 5, a vitreous silica crucible 1 for pulling silicon single crystal according to the present invention includes a surrounding wall portion 2, a curved portion 3, and a bottom portion 4, is formed of double layers including the outer layer, which is a natural fused silica layer 8, and the inner layer, which is a synthetic fused silica layer 9, and includes a plurality of micro recesses 5 in a particular area 6 of the inner surface of the surrounding wall portion 2 and a plurality of bubbles 7 in a portion of the synthetic fused silica layer 9 located below the micro recesses 5. According to the configuration, the micro recesses 5 suppress melt surface vibration of silicon melt filled inside the vitreous silica crucible 1 at the beginning of using the crucible, and then the bubbles 7 opened in the inner surface of the crucible suppress melt surface vibration of the silicon melt filled inside the vitreous silica crucible 1 at the middle stage of using the vitreous silica crucible 1. Furthermore, by forming the bubbles 7 at suitable locations, an increase in dissolution speed may be suppressed, and thus the crucible may have a long lifespan.

The bubbles 7 are exposed to a high temperature condition for a long time before the bubbles 7 are opened, and thus expansions of the bubbles 7 are saturated. Therefore, it is unlikely that the bubbles 7 rupture just below the inner surface of the surrounding wall portion. Therefore silica fragments will not be mixed into silicon melt. As a result, the yield of silicon single crystal growth may be improved.

Figure 6:
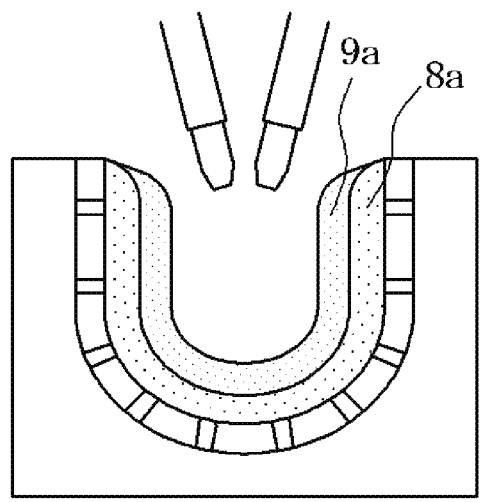
FIG. 6 is a schematic sectional view showing a method for manufacturing a vitreous silica crucible.

Generally, the vitreous silica crucible 1 for pulling silicon single crystal is, for example, formed to have a double layer structure including the natural fused silica layer 8 and the synthetic fused silica layer 9 by hardening natural silica powder 8a and synthetic silica powder 9a to a shape of a crucible by using a centrifugal force, such that the natural silica powder 8a forms the outer portion of the crucible and the synthetic silica powder 9a forms the inner portion of the crucible as shown in FIG. 6, fusing the natural silica powder 8a and the synthetic silica powder 9a during an arc discharge inside the crucible, followed by cooling.

Here, the synthetic silica powder 9a refers to powder formed of synthetic silica, and the synthetic silica is a material produced via chemical synthesis, where the synthetic silica powder is amorphous. Since a raw material of the synthetic silica is gas or liquid, the raw material of the synthetic silica may be easily refined, and synthetic silica powder may have higher purity than natural silica powder. Raw materials of synthetic fused silica include raw materials based on gases, such as silicon tetrachloride or the like, and raw materials based on liquids, such as silicon alkoxide or the like. In the present invention, the amount of impurities in synthetic fused silica may be less than or equal to 0.1 ppm.

On the other hand, the natural silica powder 8a refers to powder formed of natural silica, and the natural silica is a material acquired by mining quartz gemstones existing in nature and performing processes such as crushing, refining, and the like on the mined quartz gemstones, where the natural silica powder is formed of α-quartz crystals. Natural silica powder contains more than or equal to 1 ppm of Al and Ti. Furthermore, contents of other metal impurities in natural silica powder are higher than those in synthetic silica powder. Natural silica powder contains little silanol. Content of silanol in vitreous silica acquired by fusing natural silica powder is less than 50 ppm.

The natural fused silica 8 and the synthetic fused silica 9 may be distinguished by measuring fluorescent spectrums acquired by exciting them using an ultraviolet ray having a wavelength of 245 nm, for example, and observing a fluorescent peak.

Furthermore, although silica power is used as the raw materials of the natural fused silica 8 and the synthetic fused silica 9 in the present invention, the term "silica powder" is not limited to powder of quartz powder, and, as long as the conditions stated above are satisfied, may include powder of materials, containing silicon dioxide (silica), known as raw materials for manufacturing a vitreous silica crucible, such as crystal, quartz sand or the like.

A method of manufacturing a vitreous silica crucible for pulling silicon single crystal according to the present invention is, for example, a method of manufacturing the vitreous silica crucible 1 for pulling silicon single crystal, which includes the surrounding wall portion 2, the curved portion 3, and the bottom portion 4 and is formed of two layers including the natural fused silica layer 8 as the outer layer and the synthetic fused silica layer 9 as the inner layer, as shown in FIGS. 5 and 6. The method of manufacturing the vitreous silica crucible 1 includes a process of forming the outer layer constituted by the natural silica powder 8a, a process of forming the inner layer constituted by the synthetic silica powder 9a on the inner surface of the outer layer, and a process of fusing the silica powder 8a and 9a by generating an arc discharge inside the inner layer and forming the vitreous silica crucible 1 having the surrounding wall portion 2, the curved portion 3, and the bottom portion 4. In the process of forming the inner layer, foamable synthetic silica powder is used in a portion of the inner layer to be located below a plurality of recesses 5 to be formed later in the particular area 6 of the inner surface of the surrounding wall portion 2. The method further includes a micro recess forming process for forming the plurality of micro recesses 5 in the particular area 6 after the process of forming the vitreous silica crucible. Accordingly, the micro recesses 5 suppress melt surface vibration of silicon melt filled inside the vitreous silica crucible 1 at the beginning of using the vitreous silica crucible 1, the bubbles 7 opened in the inner surface of the vitreous silica crucible 1 suppress melt surface vibration of the silicon melt filled inside the vitreous silica crucible 1 at the middle stage of using the vitreous silica crucible 1, and, by forming the bubbles 7 at suitable locations, an increase in dissolution speed may be suppressed, so that the vitreous silica crucible 1 for pulling silicon single crystal may have a long lifespan.

Here, the term 'foamable' synthetic silica powder refers to silica powder containing water or air. As the synthetic silica powder contains water or air at the raw material stage, the plurality of bubbles 7 may be formed in a portion of the synthetic fused silica layer 9 that exists below the plurality of micro recesses 5 to be formed later in the particular area 6 of the inner surface of the surrounding wall portion 2, after the process of forming the vitreous silica crucible.

The amount of silicon melt in a vitreous silica crucible is changed as silicon single crystal is pulled up. Therefore, the particular area 6 may be suitably selected according to the amount of silicon melt in a crucible when a user is using the vitreous silica crucible, and may be at least an area where the melt surface is located at the time of forming a shoulder portion (the area from the height position $h_1$ to the height position $h_2$ in FIG. 5). Especially, the area may be, if the height of a crucible is indicated by H, an area between 0.50H and 0.99H when measured from a bottom portion of the crucible.

Figure 7:
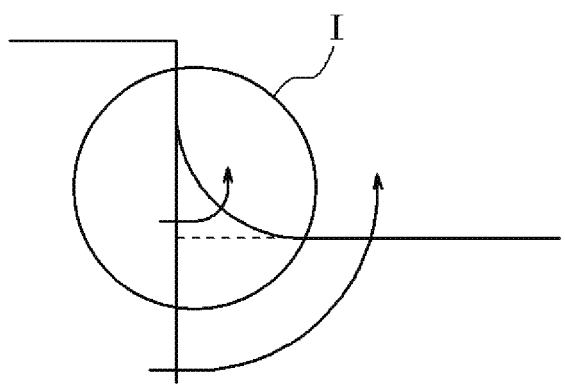
FIG. 7 is a schematic sectional view magnifying a portion of an interface between a vitreous silica crucible and silicon melt.
Figure 8:
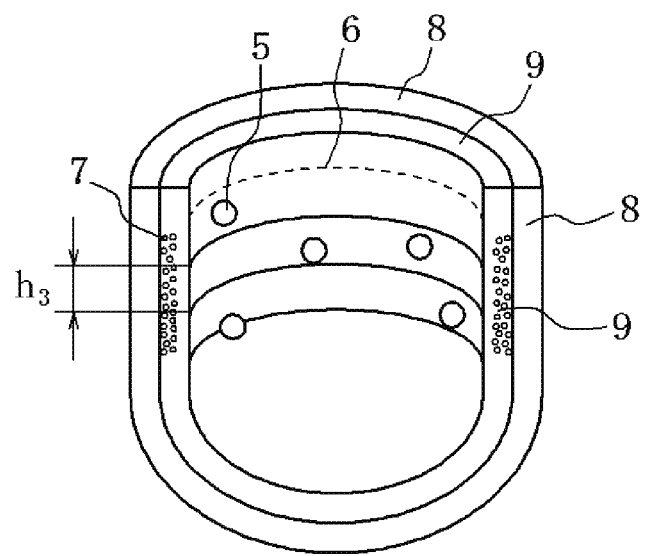
FIG. 8 is a perspective sectional view showing a pattern of forming micro recesses.

The reason that melt surface vibration easily occurs in an area where the melt surface is located will be described below. FIG. 7 is a schematic sectional view magnifying a portion of the location of the melt surface in a vitreous silica crucible having silicon melt therein. Here, due to wettability of the crucible, the liquid silicon melt has a sectional shape as shown in an area I of FIG. 7 at the interface in contact with the solid vitreous silica crucible. In the area I, since a liquid surface with low oxygen concentration in the silicon melt is closer as compared to areas other than the area I, the gradient of the oxygen concentration increases, and thus O generated in the reaction $SiO_2$ (solid)→Si (liquid)+2O stated above spreads quickly. As a result, the reaction may easily occur, and thus dissolution of a crucible is expedited. Since the area I is generally formed in an area between 0.1 mm and 5.0 mm in the height-wise direction of a crucible, the particular area 6 may include at least one micro recess 5 in each circular ring-shaped inner surface portion defined at an interval from 0.1 mm to 5.0 mm (defined at an interval of $h_3$ in FIG. 8) in the height-wise direction of the crucible.

The average diameter of the micro recess 5 may be within a range from 1 μm to 500 μm. If the average diameter of the micro recess 5 is less than 1 μm, the same effect as boiling chips as described above cannot be sufficiently acquired. On the other hand, if the average diameter of the micro recess 5 exceeds 500 μm, the same effect as boiling chips as described above cannot be sufficiently acquired and the micro recess 5 may easily disappear due to dissolution of a crucible.

The average depth of the micro recess 5 may be a depth corresponding to from 0.05% to 50% of a thickness of a crucible at the surrounding wall portion. If the average depth of the micro recesses 5 is less than a depth corresponding to 0.05% of the thickness of the crucible at the surrounding wall portion, the micro recess 5 may easily disappear due to dissolution of the crucible, and expansion of unexposed bubbles may not be saturated. On the other hand, if the average depth of the micro recesses 5 exceeds a depth corresponding to 50% of the thickness of the crucible at the surrounding wall portion 2, the strength of the wall of the crucible may be affected. Furthermore, the thickness of the surrounding wall portion 2 may be from 100 μm to 1000 μm, for example.

Furthermore, a ratio of the average diameter of the micro recesses 5 with respect to the average depth of the micro recesses 5 may be greater than 0 and less than 0.8. To suppress disappearance of the micro recesses 5 due to dissolution of a crucible, it is necessary to suppress the reaction $SiO_2$ (solid) →Si (liquid)+2O. To suppress the reaction $SiO_2$ (solid)→Si (liquid)+2O, if the oxygen concentration in silicon melt at the interface between a crucible and silicon melt is increased, it becomes difficult for the reaction to proceed. This can be achieved by preventing the oxygen generated in the reaction from spreading. Therefore, it is preferable to decide the diameters and the depths of the micro recesses 5 to meet the above-described ratio, in order to reduce effects from heat convection of the silicon melt.

The average diameter of the bubbles 7 may be from 10 μm to 100 μm, and the density of the bubbles 7 may be from 30 bubbles per $mm^3$ to 300 bubbles per $mm^3$. If the average diameter of the bubbles 7 is less than 10 μm, an effect of suppressing melt surface vibration cannot be sufficiently acquired. On the other hand, if the average diameter of the bubbles 7 exceeds 100 μm, the inner surface of a crucible may be deformed due to expansion of the bubbles 7, and thus silica fragments or the like may be mixed into silicon melt. Furthermore, if the density of the bubbles 7 is less than 30 bubbles per $mm^3$, an effect of suppressing melt surface vibration cannot be sufficiently acquired. On the other hand, if the density of the bubbles 7 exceeds 300 bubbles per $mm^3$, the inner surface of a crucible may be deformed due to expansions of the bubbles 7, and thus silica fragments or the like may be mixed into silicon melt.

An area in the synthetic fused silica layer 9, that is, the area including the plurality of bubbles 7, may be an area corresponding to from 0.5% to 30% of the thickness of the crucible at the surrounding wall portion. As a portion of the synthetic fused silica layer 9 to be located below the micro recesses 5 includes the bubbles 7, it may prevent the bubbles 7 from rupturing due to thermal expansion of the air in the bubbles 7 and may prevent silica fragments or the like from being mixed into silicon melt. Furthermore, as an area including the plurality of bubbles 7 in the synthetic fused silica layer 9 is the above-stated range, the opened bubbles 7 may suppress melt surface vibration of silicon melt even if synthetic fused silica of a crucible is dissolved and the micro recesses 5 disappear. Therefore, the vitreous silica crucible may have a long lifespan.

The micro recesses 5 may be formed using a carbon dioxide gas laser or a diamond tool. For example, a surface from which a carbon dioxide gas laser beam is emitted is arranged to face the inner surface of a crucible, and micro recesses are formed by irradiation of an infrared ray having a wavelength of 10.6 μm. Alternatively, micro recesses are formed by bringing a diamond coated drill for processing a brittle material, the drill being manufactured by Mitsubishi Materials Corporation, in contact with the inner surface of a crucible while pouring water onto the drill. Recesses are formed throughout the inner surface of a particular area by repeatedly performing grinding and rotation or elevation of a crucible.

The above description is merely an example, and the present invention is not limited to the Examples described above.

EXAMPLES

Example 1

According to the Example 1, a vitreous silica crucible for pulling silicon single crystal, the vitreous silica crucible having a double layer structure including the natural fused silica layer 8 and the synthetic fused silica layer 9 and including a surrounding wall portion, a curved portion, and a bottom portion, was formed by hardening natural silica powder 8a and synthetic silica powder 9a into a shape of a crucible by using a centrifugal force, such that the natural silica powder 8a forms the outer portion of the crucible and the synthetic silica powder 9a forms the inner portion of the crucible as shown in FIG. 6, and performing an arc discharge inside the crucible. Furthermore, foamable synthetic silica powder was used in a portion of the inner layer to be located below a plurality of recesses to be formed later in a particular area of the inner surface of the surrounding wall portion.

Next, as shown in FIG. 5, a vitreous silica crucible for pulling silicon single crystal according to the present invention was manufactured by forming a plurality of micro recesses (average diameter: 300 μm, average depth: 500 μm) in an area between 0.50H and 0.99H when measured from the bottom of the inner surface of the surrounding wall portion by using a carbon dioxide gas laser, where the height of the vitreous silica crucible is indicated by H (600 mm). Here, a plurality of bubbles (average diameter: 40 μm, density: 30 bubbles per mm$^3$) were formed in a portion of the inner layer to be located below the micro recesses (an area corresponding to from 5% to 25% of the thickness of the crucible). Furthermore, the particular area included at least one micro recess in each circular ring-shaped inner surface portion defined at an interval of 1 mm (defined at an interval of $h_3$ in FIG. 8) in the height-wise direction of the crucible. The thickness of the vitreous silica crucible at the surrounding wall portion was 12 mm.

Example 2

A vitreous silica crucible for pulling silicon single crystal according to the present invention was manufactured using a method that is the same as the method according to the Example 1, except that a plurality of micro recesses were formed in an area between 0.3H and 0.4H when measured from the bottom of the inner surface of the surrounding wall portion.

Example 3

A vitreous silica crucible for pulling silicon single crystal according to the present invention was manufactured using a method that is the same as the method according to the Example 1, except that at least one of circular ring-shaped inner surface portions defined at an interval of 6 mm in the height-wise direction of the crucible included no micro recesses.

Example 4

A vitreous silica crucible for pulling silicon single crystal according to the present invention was manufactured using a method that is the same as the method according to the Example 1, except that the average diameter of the micro recesses was 550 μm.

Example 5

A vitreous silica crucible for pulling silicon single crystal according to the present invention was manufactured using a method that is the same as the method according to the Example 1, except that the average depth of the micro recesses was 0.004 mm.

Example 6

A vitreous silica crucible for pulling silicon single crystal according to the present invention was manufactured using a method that is the same as the method according to the Example 1, except that the average diameter of bubbles was 120 μm.

Example 7

A vitreous silica crucible for pulling silicon single crystal according to the present invention was manufactured using a method that is the same as the method according to the Example 1, except that the density of bubbles was 25 bubbles per mm$^3$.

Example 8

A vitreous silica crucible for pulling silicon single crystal according to the present invention was manufactured using a method that is the same as the method according to the Example 1, except that an area including a plurality of bubbles was an area corresponding to from 32% to 50% of the thickness of a crucible at the surrounding wall portion.

Example 9

A vitreous silica crucible for pulling silicon single crystal according to the present invention was manufactured using a method that is the same as the method according to the Example 1, except that a diamond tool was used to form micro recesses.

Comparative Example 1

A vitreous silica crucible for pulling silicon single crystal according to the present invention was manufactured using a method that is the same as the method according to the Example 1, except that the vitreous silica crucible included no micro recesses.

Comparative Example 2

A vitreous silica crucible for pulling silicon single crystal according to the present invention was manufactured using a method that is the same as the method according to the Example 1, except that the vitreous silica crucible included no bubbles in a portion of the inner layer to be located below the micro recesses.

Comparative Example 3

A vitreous silica crucible for pulling silicon single crystal according to the present invention was manufactured using a method that is the same as the method according to the Example 1, except that the vitreous silica included no micro recess and no bubbles in the inner layer.

[Evaluation 1]

Evaluation of melt surface vibration was performed with respect to a vitreous silica crucible for pulling silicon single crystal manufactured as described above. Sample pieces (30 mm×30 mm) were cut from particular areas of the vitreous silica crucibles according to the Examples 1 through 9 of the present invention and the Comparative Examples 1 through 3. The sample pieces were installed in a vacuum furnace. 10 g of high purity silicon was disposed on each of the sample pieces, and the high purity silicon was fused under 20 Torr Argon pressure and at a temperature 1560° C. Oscillation periods of silicon melt were measured by measuring elevations of the surfaces of silicon fused into a shape of a drop due to surface tension by using an apparatus including a high power lens and a high speed camera capable of capturing 500 or more images per second.

[Evaluation 2]

Furthermore, a plurality of silicon single crystal ingots were fabricated according to the CZ method by using each of the crucibles according to the Examples 1 through 9 of the present invention and the Comparative Examples 1 through 3, and melt surface vibrations of silicon melt during fabrications of the first silicon single crystal ingot and the third silicon single crystal ingot were observed. During the observation, an apparatus including a high power lens and a high speed camera capable of capturing 500 or more images per second was used to observe elevation of a vitreous silica and a portion wetted by silicon melt due to surface tension (a portion at which the outermost circumferential surface of the silicon melt and the vitreous silica contact each other), and thus periods of oscillation of the silicon melt were measured. In the evaluation, periods of oscillation above 1 second were indicated by "A", periods of oscillation above ⅙ seconds and less than 1 second were indicated by "B", and periods of oscillation less than ⅙ seconds were indicated by X.

Table 1 below shows results of Evaluations 1 and 2 and the number of pulled-up silicon single crystal ingots before the thickness of surrounding wall portions of the crucibles reached 9 mm.

TABLE 1

| | Vibration Period of Melt Surface | Suppression of Melt Surface Vibration During Pull-Up | | Number of Pulled-Up Ingots | Time for Pull-Up (h) |
|---|---|---|---|---|---|
| | Vibration (second) | First Ingot | Third Ingot | | |
| Ex. 1 | 3 | A | A | 3 | 210 |
| Ex. 2 | ⅓ | B | B | 3 | 259 |
| Ex. 3 | ¼ | B | B | 3 | 274 |
| Ex. 4 | ⅕ | B | B | 3 | 260 |
| Ex. 5 | ⅙ | B | B | 3 | 277 |
| Ex. 6 | ⅙ | B | B | 3 | 268 |
| Ex. 7 | ⅙ | B | B | 3 | 278 |
| Ex. 8 | ⅙ | A | B | 3 | 230 |
| Ex. 9 | ⅙ | A | B | 3 | 234 |
| Comp. Ex. 1 | 1/14 (~180 h) 1/4 (~300 h) | X (~180 h) B (~300 h) | — | 1 | 300 |
| Comp. Ex. 2 | 1/4 (~180 h) 1/15 (~300 h) | B (~180 h) X (~300 h) | X | 1 | 300 |
| Comp. Ex. 3 | 1/14 (~300 h) | X (~300 h) | X | 0 | 300 |

Furthermore, the time for pull-up in Table 1 indicates a period of time elapsed since the temperature of a crucible reaches a temperature above 1400° C.

Furthermore, the longest possible period of time for using a vitreous silica crucible is 300 hours. The reason for this is that, although the inner surface of a crucible is covered by a circular crystal (this is cristobalite, the color of the edge of the circular crystal is brown, and the color of the inner portion is milky-white) formed through a reaction between silicon melt and vitreous silica, the crystal is peeled off after 300 hours and is mixed into silicon melt and thus the silicon single crystal is polycrystallized. Therefore, it is difficult to use a crucible for more than 300 hours. In the Comparative Example 1, the inner surface includes no micro recesses, and thus melt surface vibration is relatively intense until bubbles are exposed. After the bubbles are exposed (after about 180 hours), melt surface vibration is suppressed, and thus silicon single crystal may be pulled up. However, the number of silicon single crystal that may be pulled up during the remaining 120 hours is limited.

In the Comparative Example 2, melt surface vibration is suppressed until the micro recesses disappear (about 180 hours). However, melt surface vibration is not suppressed thereafter, and thus silicon single crystal may not be pulled up during the remaining time.

In the Comparative Example 3, melt surface vibration occurs all the time, and thus silicon single crystal cannot be pulled up.

As shown in Table 1, the vitreous silica crucibles according to the Examples 1 through 9 of the present invention are capable of stably suppressing melt surface vibrations of silicon melt and have longer lifespan as compared to the vitreous silica crucibles according to the Comparative Examples 1 through 3.

INDUSTRIAL APPLICABILITY

The present invention provides a vitreous silica crucible for pulling silicon single crystal, wherein the vitreous silica crucible includes a plurality of micro recesses in a particular area of the inner surface of a surrounding wall portion, and a plurality of bubbles in a portion of a synthetic fused silica layer located below the micro recesses, and thus is capable of stably suppressing melt surface vibration of silicon melt filled inside the vitreous silica crucible and has a long lifespan, and a method of manufacturing the vitreous silica crucible.

EXPLANATION OF REFERENCE NUMERALS

1: vitreous silica crucible
2: surrounding wall portion
3: curved portion
4: bottom portion
5: micro recess
6: particular area
7: bubble
8: natural fused silica (layer)
8a: natural silica powder
9: synthetic fused silica (layer)
9a: synthetic silica powder
H: height of vitreous silica crucible
100: vitreous silica crucible
101: silicon melt
102: seed crystal
103: neck portion
104: shoulder portion
105: straight body portion
106: tail portion
107: silicon single crystal ingot
108: natural fused silica
109: synthetic fused silica
201: opened bubble
202: bubble

What is claimed is:

1. A vitreous silica crucible for pulling silicon single crystal, comprising a surrounding wall portion, a curved portion, and a bottom portion, wherein the vitreous silica crucible comprises:
   a plurality of micro recesses provided only in a particular area of an inner surface of the surrounding wall portion, wherein the opening of each micro recess is defined by a diameter, and an average diameter of the micro recesses is from 1 μm to 500 μm; and
   a plurality of particular bubbles provided only in a section of the surrounding wall portion radially outward of the particular area containing the micro recesses, said plurality of particular bubbles being bubbles having an average diameter of 10 μm to 100 μm and distributed at a density of 30 bubbles per mm$^3$ to 300 bubbles per mm$^3$,
   wherein, if the height of a vitreous silica crucible is indicated by H, the particular area is located in an area between 0.50H and 0.99H when measured from the bottom portion of a vitreous silica crucible.

2. The vitreous silica crucible of claim 1, wherein the particular area includes at least one of the micro recesses in each of circular ring-shaped inner surface portions defined at an interval from 0.1 mm to 5.0 mm in the height-wise direction of the vitreous silica crucible.

3. The vitreous silica crucible of claim 1, wherein an average depth of the micro recess is a depth corresponding to from 0.05% to 50% of the thickness of the vitreous silica crucible at the surrounding wall portion.

4. The vitreous silica crucible of claim 1, wherein an area including the plurality of bubbles is an area corresponding to from 0.5% to 30% of the thickness of the vitreous silica crucible at the surrounding wall portion.

5. A method of manufacturing a vitreous silica crucible for pulling silicon single crystal, which comprises a surrounding wall portion, a curved portion, and a bottom portion, and is formed of double layers including an outer layer, which is a natural fused silica layer, and an inner layer, which is a synthetic fused silica layer, the method comprising:
   a process for forming the outer layer formed of natural silica powder;
   a process for forming the inner layer formed of synthetic silica powder on an inner surface of the outer layer; and
   a process for forming the vitreous silica crucible including the surrounding wall portion, the curved portion, and the bottom portion by generating an arc discharge inside the inner layer and fusing,
   wherein foamable synthetic silica powder is used in a portion of the inner layer to be located only in a section radially outward of a particular area of an inner surface of the surrounding wall portion during the process of forming the inner layer to form a plurality of particular bubbles using the foamable synthetic silica powder, said plurality of particular bubbles being bubbles having an average diameter of 10 μm to 100 μm and distributed at a density of 30 bubbles per mm$^3$ to 300 bubbles per mm$^3$, and
   the method further comprises a micro recess forming process for forming a plurality of micro recesses provided only in the particular area after the process of forming the vitreous silica crucible, wherein the opening of each micro recess is defined by a diameter, and an average diameter of the micro recesses is from 1 μm to 500 μm,
   wherein, if the height of a vitreous silica crucible is indicated by H, the particular area is located in an area between 0.50H and 0.99H when measured from the bottom portion of a vitreous silica crucible.

6. The method of claim 5, wherein the micro recesses are formed through physical grinding.

* * * * *